United States Patent [19]
Calvert

[11] Patent Number: 6,107,962
[45] Date of Patent: Aug. 22, 2000

[54] METHOD FOR MEASURING THE ELLIPSE AXES, WAVE DIRECTION, AND WAVE PROPAGATION MODE OF AN ELLIPTICALLY, CIRCULARLY, OR LINEARLY POLARIZED WAVE

[76] Inventor: W. Calvert, 219 Friendship St., Iowa City, Iowa 52245

[21] Appl. No.: 09/128,159

[22] Filed: Aug. 3, 1998

[51] Int. Cl.[7] .......................... H01Q 21/06; H01Q 21/24; H04B 7/10; G01S 13/00
[52] U.S. Cl. ........................... 342/362; 342/194; 342/364
[58] Field of Search .................................. 342/361, 362, 342/363, 364, 188, 152, 194

[56] References Cited

PUBLICATIONS 4,295,140 Brockman Oct. 31, 1981 Faraday rotation measurement method and apparatus.
4,323,898 Barnes, et al. Apr. 6, 1982 Polarization detector.
4,323,899 Barnes, et al. Apr. 6, 1982 Polarization detector.
5,323,166 Nguyen Jun. 21, 1994 Device and method for reconstructing a vector wave from amplitude measurements.
5,731,783 Graham, et al. Mar. 24, 1998 Method and apparatus for estimating radar signal polarization.
Benson, R.F., J.L. Green, S.F. Fung, B.W. Reinisch, W. Calvert, D.M. Haines, J.L. Bougeret, R. Manning, D.L. Carpenter, D.L. Gallagher, P.H. Reiff, and W.W.L. Taylor, Magnetospheric radio sounding on the Image Mission, *Radio Scicience Bulletin*, 285, 9–20, 1998.
Calvert, W., DE–1 measurements of AKR wave directions, *Geophys. Res. Lett.*, 12, 381–384, 1985.
Calvert, W., R.F. Benson, D.L. Carpenter, S.F., Fung, D.L. Gallagher, J.L. Green, D.M. Haines, P.H., Reiff, B.W. Reinisch, M.F. Smith, and W.W.L. Taylor, The feasibility of radio sounding in the magnetosphere, *Radio Science*, 30, 1577–1595, 1995.

Calvert, W., Method for measuring the wave mode and direction of a wave from a three–axis electric field measurement, submitted to *Radio Science*, Jun. 9, 1998.
Davies, K., *Ionospheric Radio*, 580 pp., Peter Peregrinus Ltd, London, UK, 1980 (Section 4.2.5 and part of Section 8.3).
Fainberg, J,L.G. Evans, and R.G. Stone, Radio tracking of solar energetic particles through interplanetary space, *Science*, 178, 743–745, 1972.
Huff, R.L., W. Calvert, J.D. Craven, L.A. Frank, and D.A. Gurnett, Mapping of auroral kilometric radiation sources to the aurora, *J. Geophys. Res.*, 93, 11,445–11,454, 1988.
Knoll, R., G. Epstein, S. Hoang, G. Huntzinger, J.L. Steinberg, J. Fainberg, F. Grena, S.R. Mosier, and R.G. Stone, The 3–dimensional radio mapping experiment (SBH) on ISEE–C, *IEEE Trans. Geoscience Electronics*, GE–16, 199–204, 1978.

*Primary Examiner*—Thomas H. Tarcza
*Assistant Examiner*—Fred Mull

[57] ABSTRACT

This invention consists of a method for measuring the direction and magnitude of the semi-major and semi-minor axes (13, 14) of the electric ellipse (5) of an incoming wave in a magnetized plasma from the in-phase and quadrature measurements (12) of the electric field that is measured on three orthogonal antennas (1, 2, 3), in order to measure the line-of-sight of the direction of wave propagation (15), and the wave propagation mode (16, 17), from the orientation and rotation sense of the measured wave electric ellipse. In addition, for a wave that consists of a linear combination of the ordinary and extraordinary modes in a magnetized plasma, these measurements can also be used to measure the line-of-sight of the direction of wave propagation (20), and the Faraday rotation angle (21), from the orientation of the semi-major axes of the electric ellipse (17, 18) that are measured at two or more adjacent frequencies.

8 Claims, 4 Drawing Sheets

$$a = E_1 \cos \phi - E_2 \sin \phi$$
$$b = E_1 \sin \phi + E_2 \cos \phi \quad (1)$$

where $E_1 = (E_{x1}, E_{y1}, E_{z1})$; $E_2 = (E_{x2}, E_{y2}, E_{z2})$ $$\phi = \frac{1}{2} \sin^{-1} \left( \frac{2 E_1 \cdot E_2}{b^2 - a^2} \right) \quad (2)$$

$$a = \sqrt{\frac{E_1^2 + E_2^2}{2} + \sqrt{\left(\frac{E_1^2 + E_2^2}{2}\right)^2 - |E_1 \times E_2|^2}} \quad (3)$$

$$b = \sqrt{\frac{E_1^2 + E_2^2}{2} - \sqrt{\left(\frac{E_1^2 + E_2^2}{2}\right)^2 - |E_1 \times E_2|^2}} \quad (4)$$

$$E_1^2 + E_2^2 = E_{x1}^2 + E_{y1}^2 + E_{z1}^2 + E_{x2}^2 + E_{y2}^2 + E_{z2}^2 \quad (5)$$

$$E_1 \cdot E_2 = E_{x1} E_{x2} + E_{y1} E_{y2} + E_{z1} E_{z2} \quad (6)$$

$$|E_1 \times E_2|^2 = (E_{y1} E_{z2} - E_{z1} E_{y2})^2$$
$$+ (E_{z1} E_{x2} - E_{x1} E_{z2})^2 + (E_{x1} E_{y2} - E_{y1} E_{x2})^2 \quad (7)$$

*Fig. 9*

METHOD FOR MEASURING THE ELLIPSE AXES, WAVE DIRECTION, AND WAVE PROPAGATION MODE OF AN ELLIPTICALLY, CIRCULARLY, OR LINEARLY POLARIZED WAVE

BACKGROUND

1. Field of the Invention

The invention consists of a method for measuring the semi-major and semi-minor axes of the electric ellipse of an elliptically, circularly, or linearly polarized wave. This invention has application for measuring the line-of-sight of the direction of wave propagation, the mode of propagation, and other properties of an electromagnetic or plasma wave in the Earth's magnetosphere, ionosphere, and interplanetary space. The apparatus for the measurement consists of three orthogonal antennas and a radio receiver that are capable of measuring the amplitude and phase of three orthogonal components of a wave electric field. This will be referred to as a three-axis electric field measurement.

As discussed by Calvert [1995], the primary application of this invention is to measure the wave mode and direction of the echoes that are produced by a satellite radio sounder in the Earth's magnetosphere. In this application, the delay of the radio echoes that are produced by a radio transmitter at the ordinary and extraordinary-mode wave cutoff frequencies can be used to measure the distance and density of different regions of the Earth's magnetosphere. The key to this technique, however, is to be able to measure the direction of an incoming wave, since a satellite sounder requires measuring the direction in order to make sense of the echoes that it receives.

As discussed by Calvert [1998], the electric field of a monochromatic electromagnetic or plasma wave always traces out an ellipse, where the plane of the ellipse is referred to as the plane of polarization. This ellipse will be referred to as the wave electric ellipse. The propagation modes in a magnetized plasma, which consist of the two solutions of the wave equation, are also found to be characterized by a different ellipse axis ratio, orientation of the electric ellipse, and rotation sense of the wave electric field. Except for wave directions that are almost exactly perpendicular to the magnetic field, it can be shown that the wave polarization for the ordinary and extraordinary modes for a radio sounder in the magnetosphere turn out to be approximately circular and perpendicular to the wave direction. The direction of the line-of-sight of wave propagation for these two modes can then be measured from the perpendicular to the wave electric ellipse.

In measuring the Earth's magnetosphere by this method, it is also relevant to measure the wave propagation mode, since this is needed in order to calculate the distance of a radio echo from the echo delay that is measured by this technique. As discussed below, this can also be measured by measuring the rotation sense of the wave electric field from the relative orientation of the semi-major and semi-minor axes of the electric ellipse.

The situation is also quite different when the ordinary and extraordinary modes overlap and are received at the same time by a radio sounder, since this can produce a linear or nearly-linear polarization from which the wave direction cannot be measured by this method. In this case, however, it then becomes possible to measure the direction of propagation from the faraday rotation at two adjacent frequencies, as follows.

As discussed by Davies [1990], faraday rotation occurs as a result of the difference in the phase velocity of the ordinary and extraordinary modes. Since the polarization of these two modes are approximately circular, this difference in phase velocity causes a rotation of the electric ellipse in the plane of polarization of the ordinary and extraordinary waves. The rotation angle that is caused by faraday rotation is then given by Equation 8.8 of Davies, [1990], in which the angle of faraday rotation is found to be proportional to the integrated plasma density times the magnetic field strength divided by the frequency squared. This equation is:

$$\Omega = \frac{\pi s f_p^2 f_H}{f^2 c} \cos\theta$$

where $\Omega$ is the angle of rotation of the major axis of the electric ellipse, c is the speed of light, $f_p$, $f_H$, and $\theta$ are the plasma frequency, cyclotron frequency, and wave angle along the wave path that produces an echo, and s is the round trip distance from the sounder to the point at which the wave reflection occurs. For a radio echo in the Earth's magnetosphere at 20 kHz, the rotation angle of faraday rotation turns out to be approximately 50 radians, corresponding to eight complete rotations of the electric ellipse. Using two frequencies that produce a difference in the faraday rotation angle, this method can then be used to measure the line-of-sight of the direction of wave propagation, along with the angle of Faraday rotation, from the relative orientation of the major axis of the electric ellipse at two adjacent frequencies.

The field of the invention therefore includes the methods for measuring the wave mode and wave propagation direction of an elliptically, circularly, or linearly polarized wave, and the field of application of this invention includes the satellite and ground-based measurements that have been used to study the Earth's magnetosphere, ionosphere, and interplanetary space.

2. Description of Prior Art

The idea for the current invention originated from a study by Calvert [1985] in which the phase of a wave that was measured on a rotating antenna was compared to the predicted phase for a wave that was traveling in different directions. This method was then used by the author and others to measure the direction of the source of the auroral kilometric radiation that accompanies the aurora, as described in a related paper by Huff et al. [1988]. This study then led to the concept of measuring the direction of a wave from the in-phase and quadrature components of the wave electric field, as discussed by Calvert, et al. [1995]. The theory for the current invention was then subsequently worked out by the author and submitted for publication to *Radio Science* on Jul. 9, 1998.

Previous studies of the Earth's ionosphere have used directive antennas and interferometric methods to measure the direction of an incoming wave. These methods are based upon measuring the direction of a wave from the differing phase of a wave that impinges on spaced antennas or different parts of the same antenna. These methods are therefore fundamentally different from measuring the orientation of the wave electric ellipse, since other than incidentally, these methods do not depend upon the orientation of the electric ellipse. These methods are widely described in the open literature, as discussed in Section 4.2.5 of Davies [1990].

A related method that has also been used to measure the direction of a wave relies upon measuring the amplitude of the wave signal that is detected on a rotating antenna. In this method, which has been referred to as the "spin null method," the amplitude null that is produced by the directivity pattern of a rotating antenna is used to measure the direction of a wave. This method thus also amounts to using a directive antenna, since the null in the directivity pattern of an antenna is simply another part of the directivity pattern of that antenna. This method is commonly used in satellite measurements because of the simplicity of using a single or multiple dipole antenna, as described by Fainberg, et al. [1972] and Knoll, et al. [1978].

U.S. Pat. No. 5,323,166 by Nguyen describes a method for reconstructing the wave electric vector by measuring the amplitudes of the electric vector in different directions. In its claims, this method requires a matrix analysis in order to determine the necessary and sufficient conditions to ensure that the measured amplitudes contain enough information to provide a unique measurement of the sinusoidally varying components of a wave electric field, whereas in the current method it is considered obvious that three orthogonal measurements of the electric field are sufficient to measure the direction and phase of an incoming wave.

U.S. Pat. No. 5,731,783 by Graham, et al. also describes a method for estimating the polarization of a radar signal from the amplitudes that are detected by an array of radar detectors having different sensitivies for different wave polarzations. As stated in the claims of this invention, the purpose of the method is to estimate the polarization of an incoming wave without reference to the phases of the signals that are produced by these measurements. This method is therefore not relevant to the current method in which the polarization of a wave is measured from the amplitude and phase of the wave signals that are measured on three orthogonal antennas.

U.S. Pat. Nos. 4,323,898 and 4,323,899 by Barnes, et al. describe a method for averaging the wave polarization of an incoming wave by measuring and averaging the Stokes parameters of a wave signal in order to detect a signal that is greater than a predetermined threshold signal. Although such averaging is not precluded by the current invention, signal averaging and comparison with a threshold are not considered relevant to the method of this invention.

U.S. Pat. No. 4,295,140 by Brockman also illustrates prior art in measuring faraday rotation. This patent, which describes a receiver system for measuring the faraday rotation of a satellite radio beacon, is the only patent that could be found that is based on measuring faraday rotation at radio frequencies. Other details of this method are also discussed in Chapter 8, Section 8.3 of Davies [1990].

The lack of patents on this topic is attributed to the unique nature of the measurements that need to be made by a satellite radio sounder in the Earth's magnetosphere, in which it is necessary to simultaneously measure the echo distance and direction of an incoming wave.

BRIEF SUMMARY OF THE INVENTION

Object and Advantages

The object of the method is to measure the ellipse axes, wave direction, and wave propagation mode of an elliptically, circularly, or linearly polarized wave. As discussed below, this can be accomplished by measuring the semi-major and semi-minor axes of the electric ellipse from the in-phase and quadrature components of a wave electric field. Although this method may have other applications, the primary application is to measure the density of the Earth's magnetosphere with a satellite radio sounder, as discussed by Benson, et al. [1998].

This method then becomes the key to measuring the Earth's magnetosphere with a satellite radio sounder where it is not feasible to use a directive antenna or spaced antennas. Another obvious advantage is that it also only requires simple electric dipole antennas, rather than a combination of electric and magnetic antennas that would otherwise be needed to measure the Poynting flux of an incoming wave. Although it would be possible to measure the direction of an echo by the spin-null method using a rapidly-rotating satellite, this method requires one rotation per measurement and does not lend itself to measuring the wave direction on the time scale of the pulsed radio echoes that are used by a satellite radio sounder.

Another advantage of the method is its ability to measure the wave mode of an echo from the sense of rotation of the wave electric field, along with the direction of propagation from the faraday rotation at adjacent frequencies, since this will permit analyzing the echo delay of the echoes that are produced by a radio sounder, and will also permit measuring the direction of an echo when the ordinary and extraordinary echoes overlap and are received at the same time by this sounder.

Although measuring the electric ellipse of an incoming wave is not a very difficult problem for a wave that is propagating in free space, a key feature of the invention is its ability to measure the magnitude and direction of the semi-major and semi-minor axes of the electric ellipse inside the plasma in which it occurs. Moreover, as discussed by Calvert [1998], it is not obvious how the axes of the electric ellipse can be measured for an arbitrary polarization and direction for an incoming wave. Another important advantage of this method over the method that was described by Calvert, et al. [1995] is therefore its ability to measure the magnitude and direction of the ellipse axes for an arbitrary circularly, elliptically, or linearly polarized wave.

DRAWING FIGURES

The drawings that are listed below illustrate the method for measuring the semi-major and semi-minor axes of the electric ellipse, along with the application of this method to measure the direction, wave mode, and faraday rotation of the radio echoes that are produced by a radio sounder.

FIG. 1. Orthogonal antennas used to measure the wave electric field.

FIG. 2. Electric ellipse of an elliptically polarized wave.

FIG. 3. Radio receiver to measure the in-phase and quadrature components of the electric field of an incoming wave, where $E_{-1}$ and $E_{-2}$ are electronic signals representing the in-phase and quadrature components of one spatial component of the wave electric field.

FIG. 4. Radio receiver to measure all three components of a wave electric field, where $E_{x1}$, $E_{y1}$, $E_{z1}$ and $E_{x2}$, $E_{y2}$, $E_{z2}$ are electronic signals that represent the x, y, and z components of the in-phase and quadrature components of the measured wave electric field.

FIG. 5. Method for measuring the direction of propagation from the orientation of the semi-major and semi-minor axes of the electric ellipse.

FIG. 6. Method for measuring the propagation mode from the rotation sense of the electric ellipse compared to the direction of the Earth's magnetic field.

FIG. 7. Method for measuring the direction of propagation from the orientation of the major axis of the electric ellipse at two adjacent frequencies.

FIG. 8. Method for measuring the angle of faraday rotation from the orientation of the electric ellipse at two adjacent frequencies.

FIG. 9. Equations to calculate the semi-major and semi-minor axes of the electric ellipse that have been derived by Calvert [1998].

LIST OF REFERENCE NUMERALS

1—Antenna to measure the x component of the wave electric field.
2—Antenna to measure the y component of the wave electric field.
3—Antenna to measure the z component of the wave electric field.
4—Coordinate system for these measurements.
5—Electric ellipse of an elliptically polarized wave.
6—Wave electric field.
7—Propagation direction.
8—Antenna,
9—Radio receiver.
10—Phase detector circuit.
11—In-phase and quadrature components of one component of the electric field.
12—Measured in-phase and quadrature components of the wave electric field.
13—Semi-major axis of the electric ellipse.
14—Semi-minor axis of the electric ellipse.
15—Direction of wave propagation.
16—Vector product showing the rotation sense of the wave electric field.
17—Direction of the magnetic field.
18, 19—Semi-major axis of the electric ellipse at two frequencies.
20—Direction of wave propagation.
21—Difference in the faraday rotation angle at two frequencies.

List of Equations in FIG. 9

Equation (1)—Equations for the semi-major and semi-minor axes of the electric ellipse.
Equation (2)—Equation for the phase angle in Equation (1).
Equation (3)—Magnitude of the semi-major axis of the electric ellipse.
Equation (4)—Magnitude of the semi-minor axis of the electric ellipse.
Equation (5)—Sum of the squared magnitudes of the wave electric field.
Equation (6)—Scalar product of the in-phase and quadrature components of the wave electric field.
Equation (7)—Magnitude of the vector product of the in-phase and quadrature components of the wave electric field.

DETAILED DESCRIPTION OF THE INVENTION

The invention consists of a new method for measuring the magnitude and direction of the semi-major and semi-minor axes of the electric ellipse of an elliptically, circularly, or linearly polarized wave that is measured by a three-axis electric field measurement, a method for measuring the wave propagation mode and the line-of-sight of the direction of wave propagation from these measurements, and also a new method for measuring the direction and faraday rotation of a radio echo from the faraday rotation of the electric ellipse at two adjacent frequencies. This method has application for measuring the direction and wave mode of the radio echoes that are detected by a satellite radio sounder in the Earth's magnetosphere, ionosphere, or interplanetary space, as described by Calvert, et al. [1995] and Benson, et al. [1998]. The details of the method are also discussed in the recent paper that has been submitted to Radio Science by Calvert [1998].

Description—FIGS. 1, 2, 3, and 4

Figure 1:
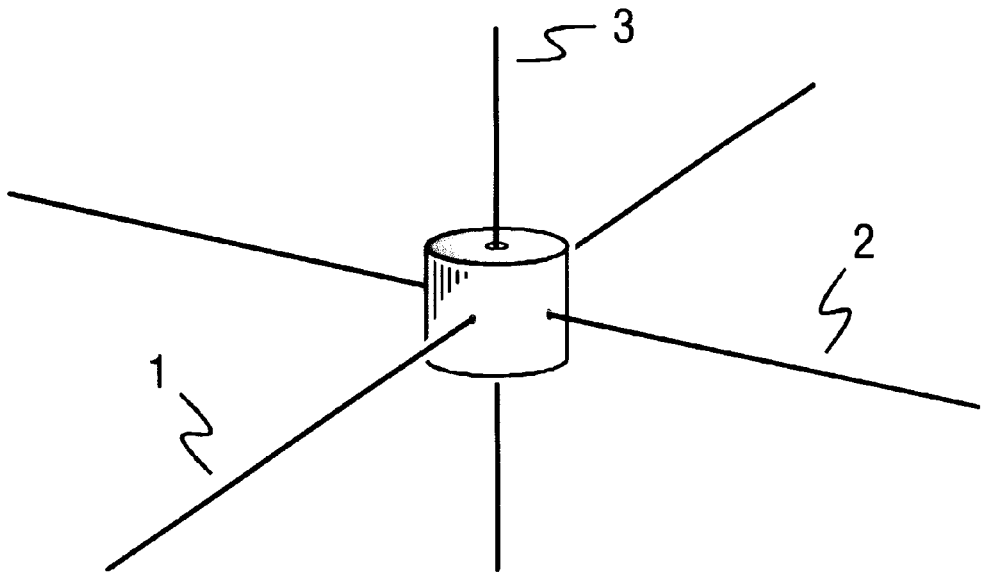
Figure 2:
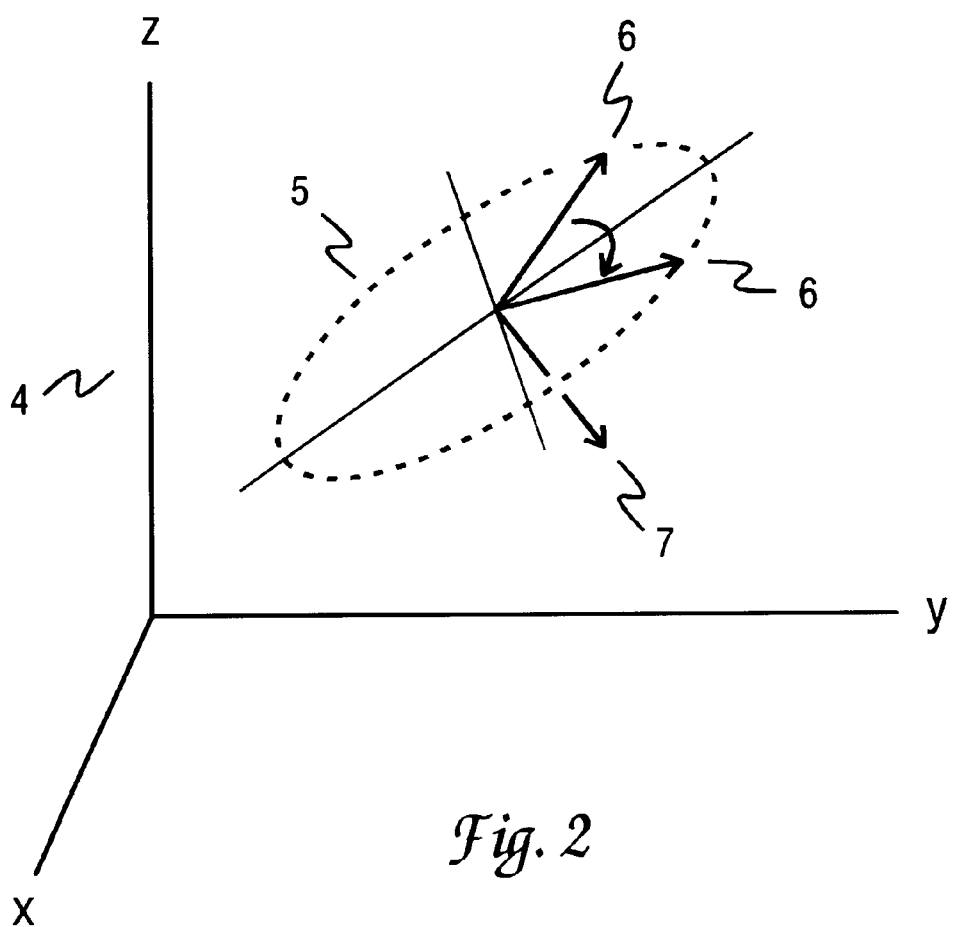
Figure 3:
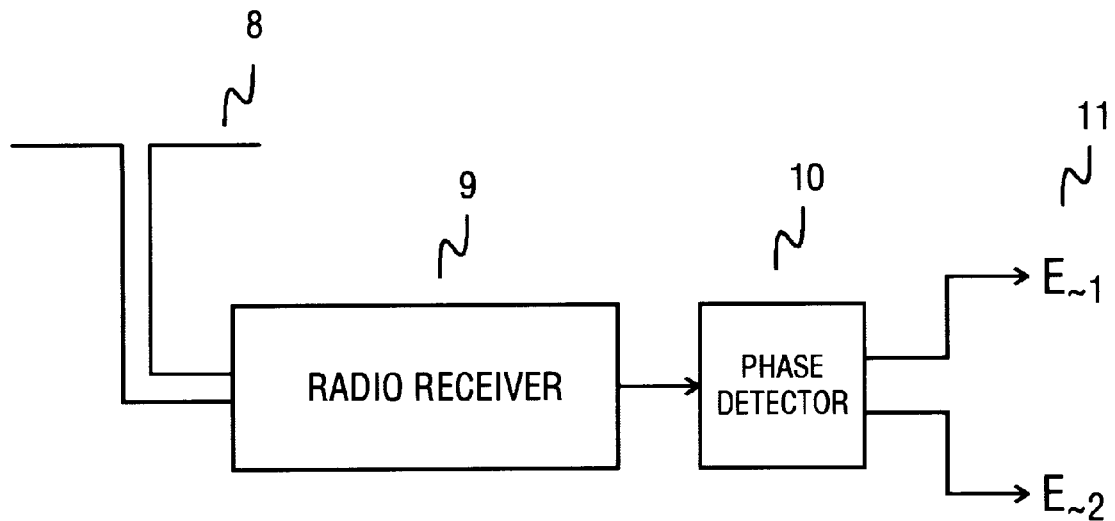
Figure 4:
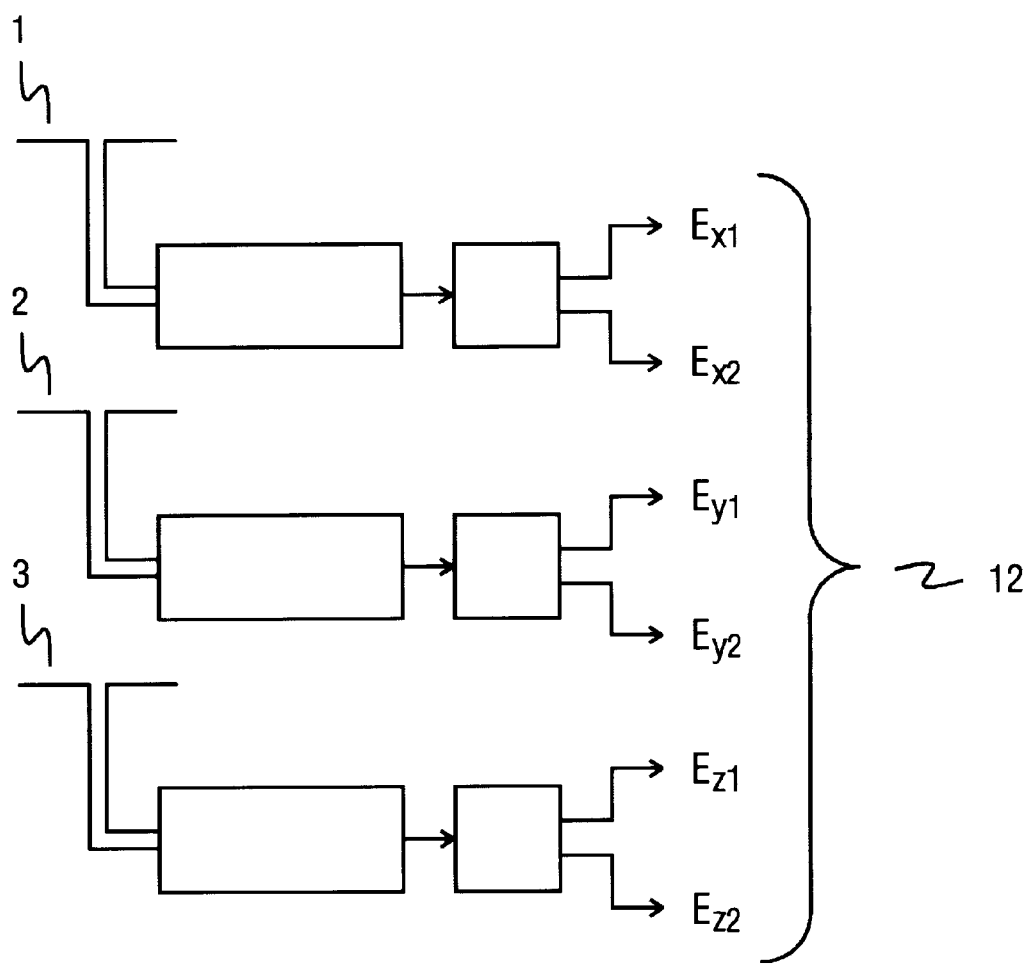

FIG. 1 shows the electric antennas (1, 2, 3) that are used to measure the electric field of the wave that is shown in FIG. 2, in which (4) represents the coordinate system that is used for these measurements, (5) represents the wave electric ellipse, (6) represents the rotating electric field of a wave, and (7) represents the direction of wave propagation for a wave that is plane polarized perpendicular to the wave propagation direction. FIG. 3 then shows a block diagram of a radio receiver that can be used to make these measurements, consisting of (8) one of these antennas, (9) a conventional radio receiver, and (10) a phase detector circuit that can be used to measure (11) the in-phase and quadrature components of the wave electric field. FIG. 4 then shows how three synchronized receivers that are connected to the x, y, and z antennas (1, 2, 3) can be used to measure (12) the in-phase and quadrature components of the wave electric field.

Description—FIGS. 5, 6, 7, 8, and 9

Figure 5:
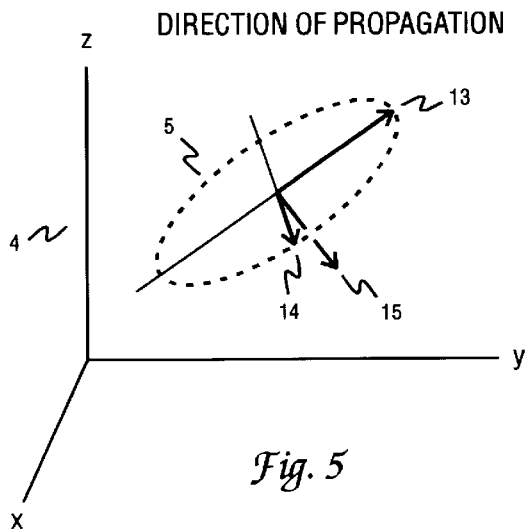

The measurements that are taken by this method consist of six scalar quantities that represent two instantaneous measurements of the wave electric field, where $E_{x1}$, $E_{y1}$, and $E_{z1}$ are the x, y, and z components of the in-phase field, and $E_{x2}$, $E_{y2}$, and $E_{z2}$ are the x, y, and z components of the quadrature field, where the quadrature field is measured with a phase lag of one-quarter cycle of the incoming wave frequency. As shown in FIG. 5, these measurements can then be used to calculate two vectors (13, 14) that represent the semi-major and semi-minor axes of the electric ellipse, as specified by Equation (1) in FIG. 9, where $E_1$ and $E_2$ are the measured in-phase and quadrature components of the electric field, and a and b are electric vectors that represent the magnitude and direction of the semi-major and semi-minor axes of the electric ellipse.

The phase angle phi in Equation (1), which represents the phase of the incoming wave with respect to the major axis of the electric ellipse, is then given by one-half the inverse sine of twice $E_1 \cdot E_2$ over $b^2 - a^2$, where $E_1 \cdot E_2$ is the scalar product of $E_1$ and $E_2$, and a and b are the magnitudes of the semi-major and semi-minor axes that are given by Equations (3) and (4). The procedure for calculating the semi-major and semi-minor axes (13, 14) of the electric ellipse is therefore to calculate a and b from Equations (3) and (4), phi from Equation (2), and then a and b from Equation (1), using the other formulas that are listed in FIG. 9 to evaluate Equations (3) and (4).

Except when a equals b, this procedure yields a unique value for the semi-major and semi-minor axes of the electric ellipse for an arbitrary polarization and arbitrary direction of an incoming wave. When a equals b, on the other hand, Equation (2) becomes indeterminate, corresponding to circular polarization. In this case, the electric ellipse can then be characterized by any two of the orthogonal directions that are given by Equation (1). As shown in FIG. 5, the vector product of the semi-major axis (13) and the semi-minor axis (14) of the electric ellipse that is measured by this method can then be used to measure the line-of-sight of the direction of wave propagation (15).

Figure 6:
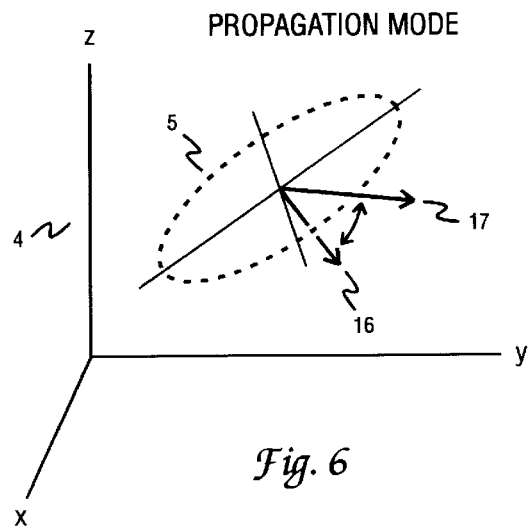

For an elliptically or circularly polarized wave, the relative orientation of a and b that are specified by Equation (1) also specify the rotation sense of the wave electric field. FIG. 6 then shows how the vector product of a and b can be used to measure the wave mode of an incoming wave by comparing its direction (16), with the direction (17) of the Earth's magnetic field. The procedure for measuring the wave mode of an incoming wave is therefore to calculate the sign of the scalar product of the vector product of a and b with the direction of the Earth's magnetic field, using a model or measurement of the Earth's magnetic field. As shown in FIG. 6, a positive value for this quantity would then indicate a right-handed, or extraordinary-mode wave, whereas a negative value would indicate a left-handed, or ordinary-mode wave.

Figure 7:
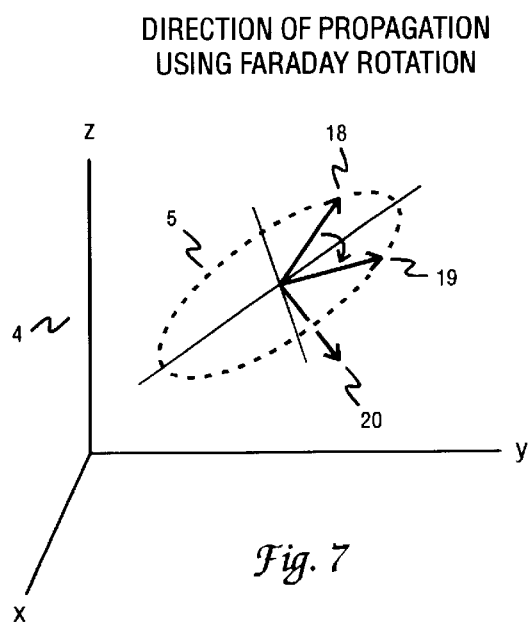
Figure 8:
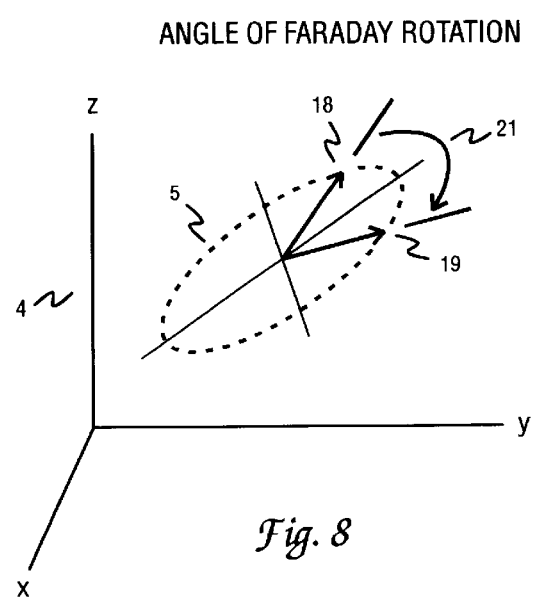

Using this method it is also possible to measure the direction of propagation for a wave that is linearly or elliptically polarized that undergoes frequency-dependent Faraday rotation as a result of the difference in the phase velocity of the ordinary and extraordinary modes. As shown in FIGS. 7 and 8, the line-of-sight of the propagation direction (20) and the angle of Faraday rotation (21) can then be calculated in the same way from the vector and scalar product of the major axis of the electric ellipse (18, 19) at two adjacent frequencies.

Operation

For a satellite radio sounder the signals that are measured by the radio receiver that is shown in FIG. 4 would be sampled by an analog-to-digital converter and analyzed by a digital computer that is programmed to carry out the required calculations. As is common practice in this field, the in-phase and quadrature components of these measurements can be sampled by measuring the signal amplitude at two times that are spaced by one-quarter of the period of the intermediate frequency of this radio receiver. The resulting measurements would then be used to analyze the radio echoes that are produced by this experiment. The precision of this method, which depends upon the signal-to-noise ratio of the echoes that are detected by a radio sounder, has been analyzed by Calvert [1995].

Conclusion, Ramifications, and Scope

As discussed above, it is relevant to be able to measure the orientation and magnitude of the semi-major and semi-minor axes of the electric ellipse of an echo in order to measure the direction and wave mode of the radio echoes that are produced by a satellite radio sounder. The scope of the invention is then based upon the analysis by Calvert [1998] which first showed how these properties can be measured from a three-axis electric field measurement. This method then forms the basis for claim 1, and dependent claims 2, 3, 4, and 5.

Since this method requires a circular or elliptical polarization in order to measure the direction of a wave, a new method that is based on measuring the faraday rotation of a radio echo at two adjacent frequencies has also been devised in order to measure the direction and faraday rotation of the radio echoes that are produced when the ordinary and extraordinary-mode echoes overlap to produce a linear or nearly-linear polarization. This method forms the basis for Claims 6, 7, and 8.

Although this method envisages three orthogonal antennas to measure all three components of the wave electric field, the same method would also work for two or more antennas that measure different spatial components of the electric field, since the projection of the electric ellipse in any direction can be used to measure the projection of the semi-major and semi-minor axes of the electric ellipse in that direction.

It is also relevant to point out that the method of this invention lends itself to implementation on a digital computer in which the algorithm that is defined by the equations in Drawing 4 produces a valid result in all cases, regardless of the measured values of the in-phase and quadrature components of the wave electric field. This invention can therefore be used to advantage in a satellite project in which large quantities of data are analyzed by this method, and the results of this method, along with the echo delay that is measured by a satellite radio sounder, then become the primary data that are used by the scientific research community that will analyze these results.

What is claimed is:

1. A method of measuring line of sight direction of wave propagation electric ellipse orientation and rotation sense, and wave propagation mode of an elliptically, circularly, or linearly polarized wave field comprising:

(a) measuring in-phase and quadrature electric components of said wave field, and (b) calculating properties of the polarization electric ellipse of said wave field from the resulting measurements.

2. The method of claim 1 wherein line of sight direction of wave propagation of said wave field is measured from the orientation of the electric ellipse of said wave field.

3. The method of claim 1 wherein electric ellipse orientation and rotation sense of said wave field are measured from the orientation and relative phase of the semi-major and semi-minor axes of the electric ellipse of said wave field.

4. The method of claim 1 wherein propagation mode is determined from the orientation and rotation sense of the electric ellipse of said wave field.

5. The method of claim 1 wherein ellipse axis ratio is calculated from the magnitudes of the semi-major and semi-minor axes of the electric ellipse of said wave field.

6. A method of measuring faraday rotation comprising:

(a) transmitting a wave that produces an echo at one or more frequencies, (b) measuring in-phase and quadrature electric components of the resulting echoes, and (c) calculating orientation of the electric ellipse of said echoes from the resulting measurements.

7. The method of claim 6 wherein line of sight direction of wave of propagation is measured from the orientation of the electric ellipse of said echoes at two or more frequencies.

8. The method of claim 6 wherein angle of faraday rotation is measured from the orientation of the electric ellipse of said echoes at two or more frequencies.

* * * * *